United States Patent
Sze et al.

(10) Patent No.: US 7,733,114 B2
(45) Date of Patent: Jun. 8, 2010

(54) TEST HANDLER INCLUDING GRIPPER-TYPE TEST CONTACTOR

(75) Inventors: Chak Tong Albert Sze, Hong Kong (CN); Pei Wei Tsai, Hong Kong (CN); Sai Kit Wong, Hong Kong (CN); Wai Hong Sizto, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 94 days.

(21) Appl. No.: 12/255,057

(22) Filed: Oct. 21, 2008

(65) Prior Publication Data

US 2010/0097083 A1    Apr. 22, 2010

(51) Int. Cl.
 *G01R 31/26* (2006.01)
(52) U.S. Cl. ...................................... 324/767
(58) Field of Classification Search ........................ None
See application file for complete search history.

(56) References Cited

U.S. PATENT DOCUMENTS 4,489,477 A * 12/1984 Chik et al. ..................... 438/17
6,501,260 B1 * 12/2002 Hu et al. ................... 324/158.1
6,597,195 B1 * 7/2003 Beaudry et al. ............. 324/767
2006/0022124 A1 * 2/2006 Chuang ................. 250/227.28

* cited by examiner

*Primary Examiner*—Paresh Patel
(74) *Attorney, Agent, or Firm*—Ostrolenk Faber LLP

(57) ABSTRACT

A test handler is provided for testing electronic devices having light-emitting elements. Electronic devices are mounted at a loading position, optical measurements are conducted at a test contact position where a testing device is located for optical communication with the light-emitting elements and then tested electronic devices are removed at an unloading position. Multiple test contactors hold the electronic devices and move them to and through the loading position, test contact position and unloading position in sequence. Each test contactor comprises a device contact point including electrical conductors which are connected to electrical contacts of the electronic device when the electronic device is mounted at the device contact point, and a retaining mechanism grips the electronic device at the device contact point such that the retaining mechanism does not obstruct the optical communication between the testing device and the light-emitting element at the test contact position.

20 Claims, 4 Drawing Sheets

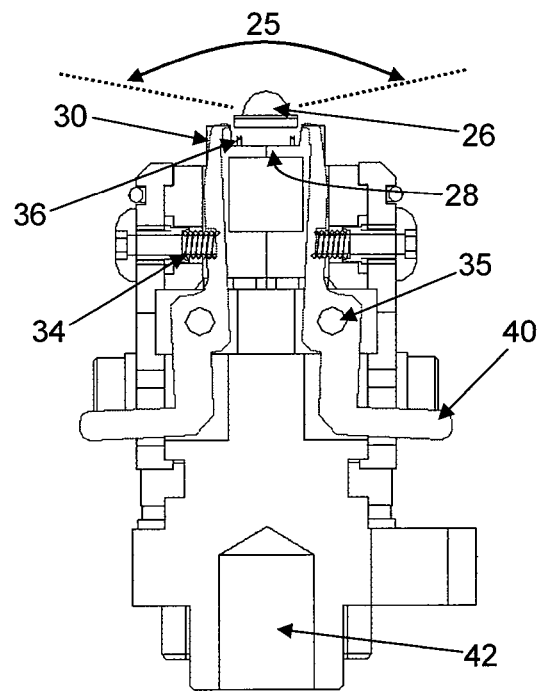
FIG. 4
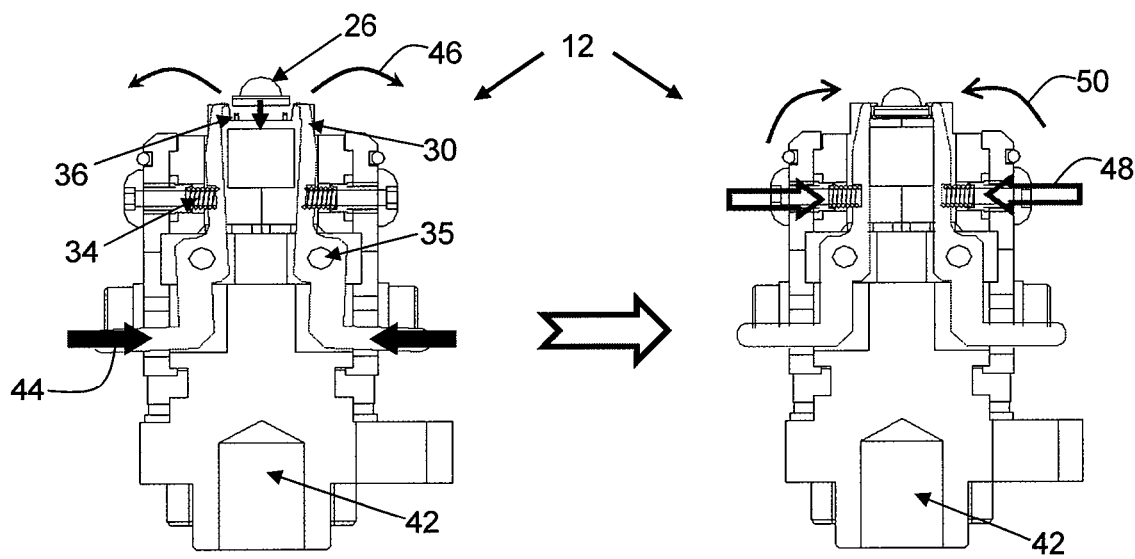
FIG. 5A  FIG. 5B

TEST HANDLER INCLUDING GRIPPER-TYPE TEST CONTACTOR

FIELD OF THE INVENTION

The invention relates to a test handler for testing electronic devices, and in particular to a test contactor comprised in the test handler for positioning the electronic devices during testing.

BACKGROUND AND PRIOR ART

Test handlers are used in the semiconductor industry for testing electronic devices, such as integrated circuits, semiconductor chips and the like. There is a constant demand for such electronic devices to be produced at less cost and in smaller dimensions, increasing the challenges faced when designing apparatus to test such electronic devices.

Test contactors comprised in test handlers generally position the electronic device for testing by a tester. Contact pins of the test contactor are connected to the electronic device during testing to make electrical contact with the device under test ("DUT"). The test contactor is usually incorporated as part of or subsequently coupled to a tester depending on the type of device being tested.

In the case of light-emitting electronic or photonics devices, such as light-emitting diodes ("LEDs"), the tester typically includes sensors for measuring the intensity and/or quality of the light emitted. A challenge faced when testing LEDs is to be able to effectively observe the light emitted by the LED with sensors which are located at a certain distance from the LED. An unblocked line of sight should preferably be maintained between the LED and the sensors while the device is held securely and electrically connected at the testing position.

One traditional type of test contactor for LEDs comprises an insulation socket with a contact pin incorporated in the socket. An LED is inserted into the insulation socket to make electrical contact with the contact pin so as to illuminate the LED. An optical test is then conducted. Thus, the position of the test contactor is fixed at the testing position. Automation of the testing process may comprise the steps of using a pick arm to transfer the LED to the insulation socket, inserting the LED into the insulation socket with the pick arm to make contact with the contact pin in order to light up the LED for testing, and then removing the LED from the insulation socket. A disadvantage of this approach is that the pick arm typically has to be positioned over the insulation socket, and therefore blocks some of the light emitted from the LED. The resulting test is hence less accurate since some of the light is blocked. The movement of the pick arm to pick and position one LED at a time at the insulation socket is also relatively slow.

SUMMARY OF THE INVENTION

It is thus an object of the invention to seek to provide a test contactor which does not block the light emitted by a light-emitting device being tested so that a substantially unblocked illumination field is possible during testing.

It is another object of the invention to seek to carry out testing of a light-emitting device more efficiently than in the prior art in order to improve the productivity of a test handler.

According to a first aspect of the invention, there is provided a test handler for testing electronic devices having light-emitting elements, comprising: a loading position whereat the electronic devices to be tested are mounted; a test contact position whereat a testing device is located for optical communication with the light-emitting elements in order to conduct optical measurements thereof; an unloading position whereat tested electronic devices are removed after testing; multiple test contactors operative to hold the electronic devices and to move them to and through the loading position, test contact position and unloading position in sequence; wherein the test contactors each comprises: a device contact point including electrical conductors which are connected to electrical contacts of the electronic device when the electronic device is mounted at the device contact point; and a retaining mechanism operative to grip the electronic device at the device contact point such that the retaining mechanism does not obstruct the optical communication between the testing device and the light-emitting element at the test contact position.

According to a second aspect of the invention, there is provided a method of testing electronic devices having light-emitting elements, comprising the steps of: mounting an electronic device to be tested onto a device contact point of a test contactor at a loading position so that electrical contacts of the electronic device are connected to electrical conductors of the device contact point; gripping the electronic device at the device contact point with a retaining mechanism; moving the test contactor holding the electronic device to a test contact position where a testing device is located and supplying an electrical current to the device contact point to illuminate the light-emitting element; establishing optical communication between the testing device and the illuminated light-emitting element without obstruction by the retaining mechanism in order to conduct optical measurements; and after conducting optical measurements, moving the electronic device to an unloading position and removing the electronic device from the test contactor.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIG. 4 is a cross-sectional side view of the test contactor according to the preferred embodiment of the invention for mounting a light-emitting device for testing; and FIGS. 5A and 5B are cross-sectional side views of the test contactor illustrating the mounting of a light-emitting device onto the test contactor.

DETAILED DESCRIPTION OF THE PREFERRED EMBODIMENT OF THE INVENTION

Figure 1:
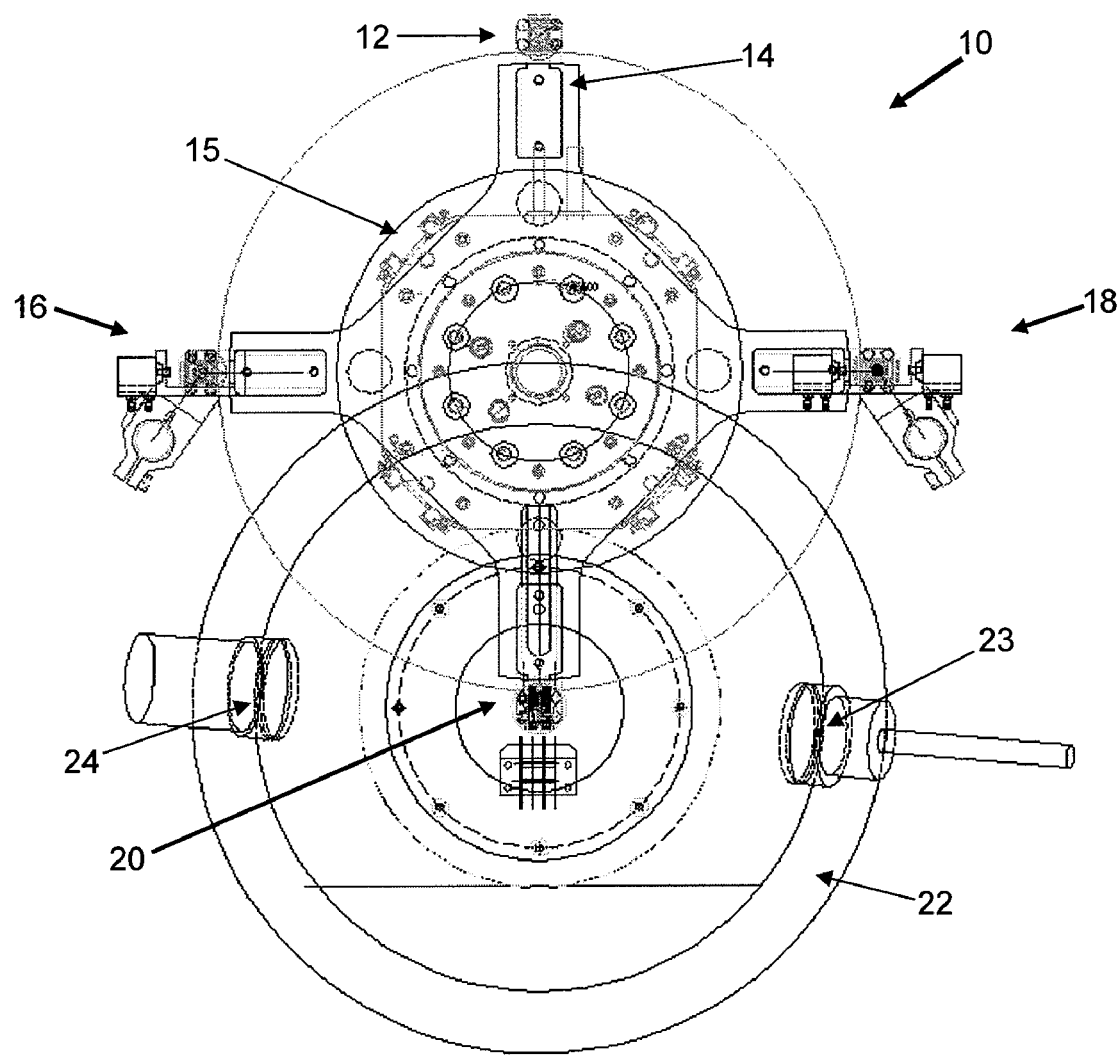
FIG. 1 is a plan view of a test handler incorporating test contactors according to the preferred of the invention, including multiple rotary pick arms and a test contact position.

FIG. 1 is a plan view of a test handler 10 incorporating multiple test contactors 12 according to the preferred of the invention, including multiple rotary pick arms 14 and a test contact position 20. In the illustrated embodiment, there are a total of four rotary pick arms 14 which are connected to a rotary turret 15. The turret 15 rotates each test contactor 12 located at the end of each rotary pick arm 14 sequentially from a loading position 16 at which electronic devices in the form of light-emitting devices having light-emitting elements are mounted onto the test contactors 12, through a test contact position 20 where optical measurements of the light-emitting devices are made, then to an unloading position 18 where the tested light-emitting devices are removed from the test handler 10 after the said optical measurements.

A testing device such as a testing sphere 22 is located at the test contact position 20 where the light-emitting device is tested. The testing sphere 22 has a bottom hole into which the light-emitting device is insertable such that a viewing angle of the light-emitting device is located substantially within the inner surfaces of the testing sphere 22. A first adaptor (comprising an auxiliary light source 23 for calibration) and a second adaptor (comprising an optical sensor 24 connected to an optical fibre) are attached to the inner surfaces of the testing sphere in order to measure selected optical characteristics of the light-emitting device when the device is energized and illuminated. There is optical communication between the light-emitting element of the light-emitting device and the testing device, more specifically the optical sensor 24 of the second adaptor in the testing sphere 22. After electrical and optical measurements have been made on the light-emitting device, the measurements are recorded on a database and the tested light-emitting device may then be removed from test handler 10 at the unloading position 18 by another pick arm (not shown).

Figure 2:
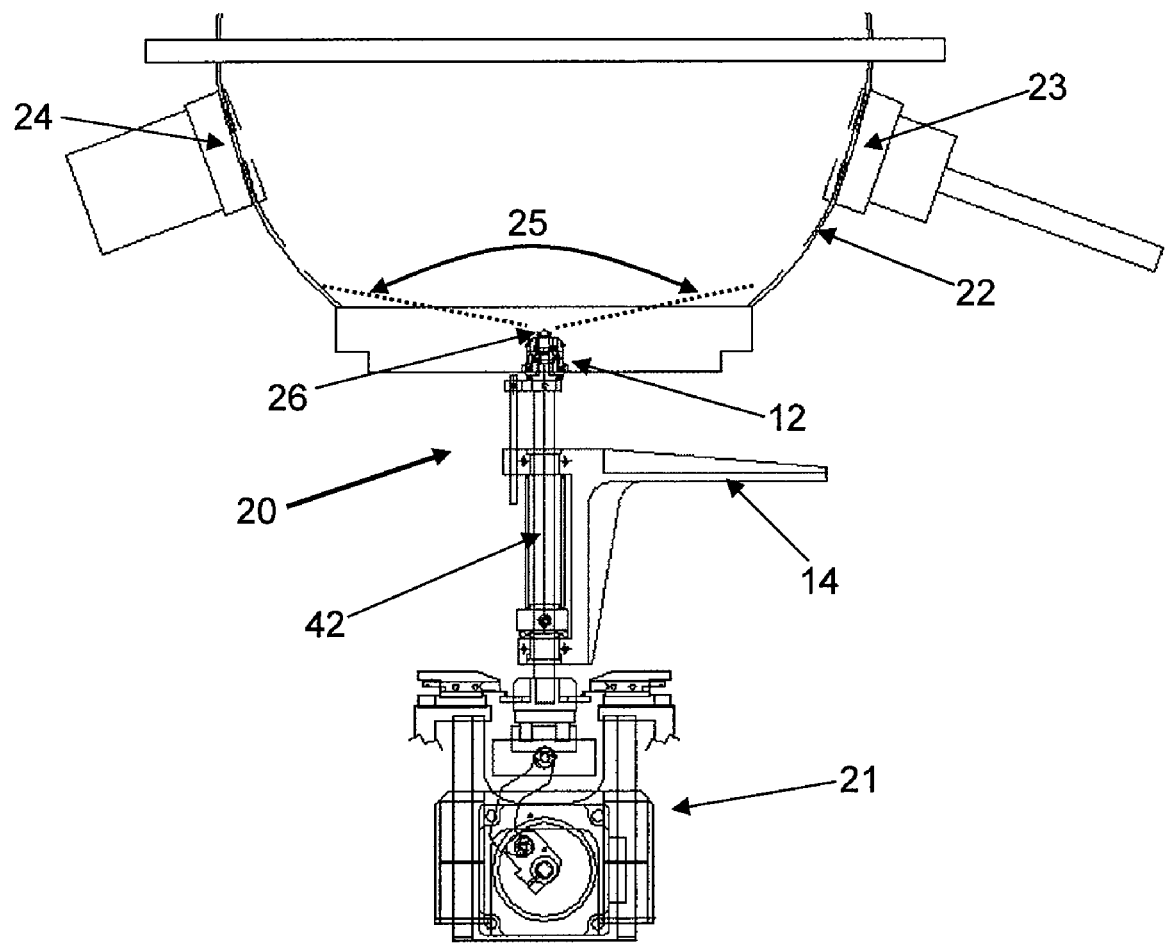
FIG. 2 is a cross-sectional side view of the test contact position of the test handler where a light-emitting device is tested.

FIG. 2 is a cross-sectional side view of the test contact position 20 of the test handler 10 where the light-emitting device 26 is tested. A driving motor such as a push-up motor 21 is positioned at the test contact position 20 next to the test contactor 12, preferably below the test contactor 12, and it is operative to push the test contactor 12 towards the testing sphere 22. After the rotary pick arm 14 has been rotated and moves a test contactor 12 holding the light-emitting device 26 to the test contact position 20, the push-up motor 21 will actuate upwards so as to push a support rod 42 supporting a base of the test contactor 12 upwards. The lifting of the test contactor 12 by the actuation of the push-up motor 21 inserts the light-emitting element of the light-emitting device 26 through a hole located at the bottom of the testing sphere 22 so that the illumination field 25 of the light-emitting device 26 is located inside the inner surfaces of the testing sphere 22. The unblocked illumination field 25 fully illuminates the inner surfaces of the testing sphere 22, making the measurements of the optical properties of the light-emitting device 26 by the optical sensor 24 more accurate than in prior art testing apparatus, where the illumination field 25 may be partially blocked.

Figure 3:
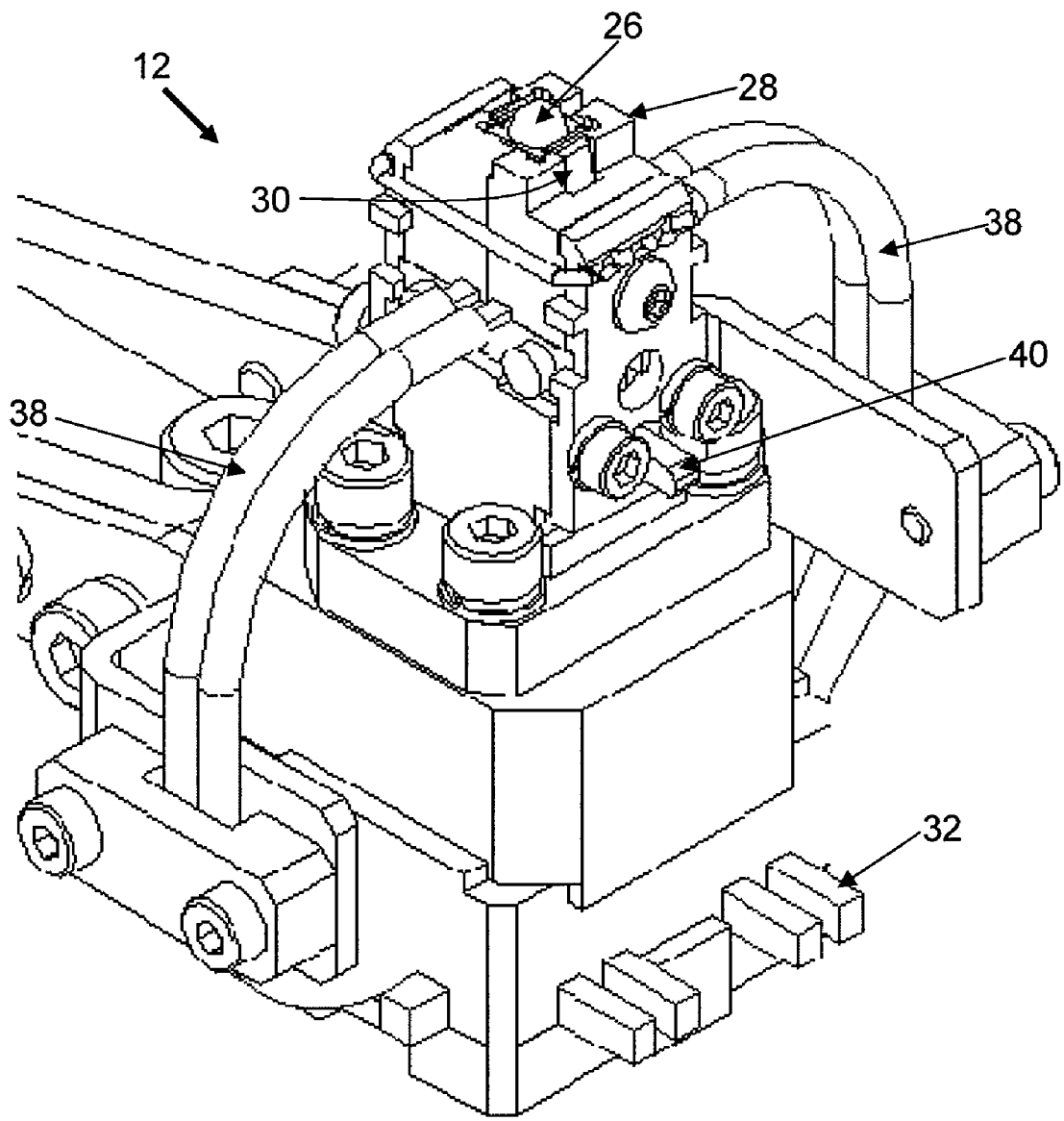
FIG. 3 is an isometric view of the test contactor.

FIG. 3 is an isometric view of the test contactor 12. It generally comprises a device contact point 28, a retaining mechanism which may comprise gripper arms 30 to grip the light-emitting device 26 at the device contact point 28, and extension cables 38 to electrically connect conductors of the device contact point 28 to an electrical supply contact point 32, which is remote from the device contact point 28. At the electrical supply contact point 32, electrical contacts linked to a testing instrument (not shown) may receive electrical currents and transmit them to the light-emitting device 26 through the electrical conductors of the device contact point 28. A gripper actuator 40 is operable to open and close the gripper arms 30 during mounting and removal of the light-emitting device 26 from the test contactor 12. The gripper arms 30 close onto and grip the sides of the light-emitting device 26 to secure the device 26 without blocking the light emitted from its top surface, and does not obstruct the optical communication between the testing device and the light-emitting element of the light-emitting device 26 at the test contact position 20.

FIG. 4 is a cross-sectional side view of the test contactor 12 according to the preferred embodiment of the invention for mounting a light-emitting device 26 for testing. The electrical conductors, which may be in the form of pogo pins 36, are located in positions corresponding to positions of electrical contacts on the light-emitting device 26 when it is mounted onto the test contactor 12, so that electrical currents may be provided to it at the device contact point 28. As mentioned above, the light-emitting device 26 will illuminate when an electrical current is supplied to it. The pogo pins 36 are in turn electrically connected to the electrical supply contact point 32 by way of the extension cables 38.

The illustration also shows the connection between the gripper arms 30 and the gripper actuators 40, which are pivotally arranged relative to one another via pivots 35 such that when the gripper actuator 40 is pushed inwards, the gripper arm 30 will open outwards. When the pushing force 40 is absent, gripper preload springs 34 which are operatively connected to the gripper arms 30 will apply spring forces to close the gripper arms 30 to secure the sides of the light-emitting device 26. As explained above, the support rod 42 at the base of the test contactor 12 may be pushed by the push-up motor 21 to raise the light-emitting device 26 towards the testing sphere 22 at the test contact position 20.

FIGS. 5A and 5B are cross-sectional side views of the test contactor 12 illustrating the mounting of a light-emitting device 26 onto the test contactor 12. At the loading position 16 (FIG. 5A), a pushing force 44 is applied to the gripper actuators 40 to push the gripper actuators 40 inwards. This will cause the gripper arms 30 to open outwards 46 and allow the light-emitting device 26 to be placed onto the pogo pins 36 at the device contact point 28.

In FIG. 5B, the pushing force 44 is discontinued after the light-emitting device 26 has been placed onto the pogo pins 36. Spring forces 48 from the gripper preload springs 34 bias the gripper arms 30 to close inwards 50 onto the sides of the light-emitting device 26. Thus, the light-emitting device 26 is secured onto the test contactor 12 with an unblocked illumination field 25. Thereafter, the test contactor 12 holding the light-emitting device 26 is moved from the loading position 16 to the test contact position 20 for testing the light-emitting device 26.

It should be appreciated that by combining the test contactor 12 with gripper arms 30 to hold the light-emitting device 26 under test, it allows an unblocked viewing angle for observing the light emitted by the device 26. The incorporation of two separate electrical contact points 28, 32 on the test contactor 12 allow coupling of electrical connections at the test contact position 20 to illuminate the device 26 without further need to reorientate the device 26 after loading at the loading position.

Moreover, the test contactors 12 allow for easier conversion of the test handler 10 for mounting different dimensions of light-emitting devices 26 which are to be handled. The gripper arms 30 also allow for quick mounting and removal of light-emitting devices 26 from the test contactor 12, as well as automatic alignment of the light-emitting device 26 on the test contactor 12, thereby increasing productivity.

The invention described herein is susceptible to variations, modifications and/or additions other than those specifically described and it is to be understood that the invention includes all such variations, modifications and/or additions which fall within the spirit and scope of the above description.

The invention claimed is:

1. A test handler for testing electronic devices having light-emitting elements, comprising:
   a loading position whereat the electronic devices to be tested are mounted;
   a test contact position whereat a testing device is located for optical communication with the light-emitting elements in order to conduct optical measurements thereof;
   an unloading position whereat tested electronic devices are removed after testing;
   multiple test contactors operative to hold the electronic devices and to move them to and through the loading position, test contact position and unloading position in sequence;
   wherein the test contactors each comprises:
   a device contact point including electrical conductors which are connected to electrical contacts of the electronic device when the electronic device is mounted at the device contact point; and
   a retaining mechanism operative to grip the electronic device at the device contact point such that the retaining mechanism does not obstruct the optical communication between the testing device and the light-emitting element at the test contact position.

2. The test handler as claimed in claim 1, wherein the test contactor further comprises an electrical supply contact point remote from but electrically connected to the device contact point, which is operative to receive electrical currents at the test contact position and to transmit said electrical currents to the electronic device mounted at the device contact point.

3. The test handler as claimed in claim 2, further comprising extension electrical cables connecting the electrical supply contact point to the electrical conductors of the device contact point.

4. The test handler as claimed in claim 1, wherein the testing device comprises a testing sphere including an optical sensor, the testing sphere further comprising a hole through which the light-emitting element of the electronic device is insertable.

5. The test handler as claimed in claim 4, further comprising a driving motor positioned next to the test contactor at the test contact position which is operative to push the test contactor towards the testing sphere.

6. The test handler as claimed in claim 5, wherein the driving motor is operative to push the light-emitting element to a position where an illumination field of the light-emitting element is located inside inner surfaces of the testing sphere.

7. The test handler as claimed in claim 5, further comprising a support rod supporting a base of the test contactor which is actuable by the driving motor to push the test contactor towards the testing sphere.

8. The test handler as claimed in claim 1, wherein the electrical conductors at the device contact point comprise pogo pins.

9. The test handler as claimed in claim 1, wherein the retaining mechanism comprises gripper arms which are operative to close onto the sides of the electronic device to grip the sides of the electronic device.

10. The test handler as claimed in claim 9, further comprising gripper actuators pivotally arranged relative to the gripper arms such that the gripper arms are movable to open by applying a pushing force to the gripper actuators.

11. The test handler as claimed in claim 10, further comprising preload springs operatively connected to the gripper arms to apply spring forces to bias the gripper arms to close the gripper arms onto the electronic device when the pushing force is removed.

12. The test handler as claimed in claim 1, wherein the multiple test contactors are located on a rotary turret.

13. Method of testing electronic devices having light-emitting elements, comprising the steps of:
   mounting an electronic device to be tested onto a device contact point of a test contactor at a loading position so that electrical contacts of the electronic device are connected to electrical conductors of the device contact point;
   gripping the electronic device at the device contact point with a retaining mechanism;
   moving the test contactor holding the electronic device to a test contact position where a testing device is located and supplying an electrical current to the device contact point to illuminate the light-emitting element;
   establishing optical communication between the testing device and the illuminated light-emitting element without obstruction by the retaining mechanism in order to conduct optical measurements; and
   after conducting optical measurements, moving the electronic device to an unloading position and removing the electronic device from the test contactor.

14. Method as claimed in claim 13, wherein the step of supplying an electrical current to the device contact point comprises the step of supplying an electrical current to an electrical supply contact point of the test contactor which is remote from but electrically connected to the device contact point, and transmitting the electrical current from the electrical supply contact point to the electronic device mounted at the device contact point.

15. Method as claimed in claim 13, wherein the testing device comprises a testing sphere including an optical sensor, the testing sphere further comprising a hole through which the light-emitting element of the electronic device is insertable.

16. Method as claimed in claim 15, further comprising the step of pushing the test contactor towards the testing sphere prior to establishing optical communication between the light-emitting element and the testing sphere.

17. Method as claimed in claim 16, wherein the test contactor is pushed to a position where an illumination field of the light-emitting element is located inside inner surfaces of the testing sphere.

18. Method as claimed in claim 13, wherein the electrical conductors at the device contact point comprise pogo pins.

19. Method as claimed in claim 13, wherein the retaining mechanism comprises gripper arms which close onto the sides of the electronic device to grip the sides of the electronic device.

20. Method as claimed in claim 19, wherein the gripper arms are biased to close onto the sides of the electronic device by preload springs operatively connected to the gripper arms.

* * * * *